(12) United States Patent
Yang et al.

(10) Patent No.: US 7,851,276 B2
(45) Date of Patent: Dec. 14, 2010

(54) METHODS AND STRUCTURES FOR PLANAR AND MULTIPLE-GATE TRANSISTORS FORMED ON SOI

(75) Inventors: Fu-Liang Yang, Hsin-Chu (TW);
Yee-Chia Yeo, Hsin-Chu (TW);
Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 559 days.

(21) Appl. No.: 11/676,480

(22) Filed: Feb. 19, 2007

(65) Prior Publication Data

US 2007/0134860 A1 Jun. 14, 2007

Related U.S. Application Data

(62) Division of application No. 10/823,158, filed on Apr. 13, 2004, now Pat. No. 7,180,134.

(60) Provisional application No. 60/540,680, filed on Jan. 30, 2004.

(51) Int. Cl.
*H01L 21/00* (2006.01)
*H01L 21/48* (2006.01)

(52) U.S. Cl. .............. 438/149; 438/153; 438/154; 438/164; 257/347

(58) Field of Classification Search ........... 257/347, 257/331, E29.125, E29.131; 438/149, 153–154, 438/164, 259

See application file for complete search history.

(56) References Cited

U.S. PATENT DOCUMENTS

| 6,222,234 | B1 | 4/2001 | Imai |
| 6,413,802 | B1 | 7/2002 | Hu et al. |
| 6,911,383 | B2 * | 6/2005 | Doris et al. ............... 438/588 |
| 2002/0011612 | A1 * | 1/2002 | Hieda ....................... 257/262 |
| 2005/0017377 | A1 | 1/2005 | Joshi et al. |

OTHER PUBLICATIONS

Chau, R., et al., "A 50nm Depleted-Substrate CMOS Transistor (DST)," IEDM, Mar. 2001, pp. 621-624, IEEE.
Shahidi, G.G., "SOI Technology for the GHz Era," IBM Journal Res. & Dev., Mar./May 2002, pp. 121-131, vol. 46, No. 2/3, International Business Machines Corporation.

* cited by examiner

*Primary Examiner*—Theresa T Doan
(74) *Attorney, Agent, or Firm*—Slater & Matsil, L.L.P.

(57) ABSTRACT

A semiconductor device includes an insulator layer, a semiconductor layer, a first transistor, and a second transistor. The semiconductor layer is overlying the insulator layer. A first portion of the semiconductor layer has a first thickness. A second portion of the semiconductor layer has a second thickness. The second thickness is larger than the first thickness. The first transistor has a first active region formed from the first portion of the semiconductor layer. The second transistor has a second active region formed from the second portion of the semiconductor layer. The first transistor may be a planar transistor and the second transistor may be a multiple-gate transistor, for example.

15 Claims, 5 Drawing Sheets

METHODS AND STRUCTURES FOR PLANAR AND MULTIPLE-GATE TRANSISTORS FORMED ON SOI

TECHNICAL FIELD

This application is a divisional of U.S. patent application Ser. No. 10/823,158, entitled "Methods and Structures for Planar and Multiple-Gate Transistors Formed on SOI," filed on Apr. 13, 2004 now U.S. Pat. No. 7,180,134, which application claims the benefit of U.S. Provisional Application Ser. No. 60/540,680 filed on Jan. 30, 2004, which applications are hereby incorporated herein by reference.

TECHNICAL FIELD

The present invention generally relates to fabrication of semiconductor devices. In one aspect it relates more particularly to multiple-gate and planar transistors formed on a semiconductor-on-insulator (SOI) substrate structure.

BACKGROUND

A current trend is that the thickness of the semiconductor layer in typical semiconductor-on-insulator (SOI) substrates is decreasing for planar transistors as the technology generations change (e.g., 130 nm to 90 nm to 65 nm technology generation). Currently, the typical thickness of the active region for a planar transistor fabricated using an SOI structure is about 400 angstroms, and is expected to become smaller in future technology generations.

Figure 1:
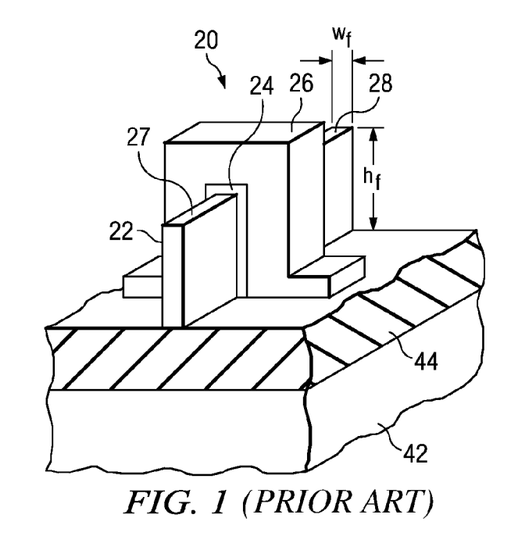
FIG. 1 is a perspective view a multiple-gate transistor structure.

As shown in FIG. 1, a multiple-gate transistor 20 (e.g., FinFET) typically has a vertical semiconductor fin 22. The vertical semiconductor fin 22 is also known as the active region. The gate dielectric 24 and gate electrode 26 cover a large portion or a majority of the surface of the active region 22 at the channel region because most of the current is conducted along the sidewalls. Thus, generally, a taller fin 22 is better for conducting larger currents, and the vertical fin structure allows for more gate electrode area for better control of the larger currents. The fin height $h_f$ in a multiple-gate transistor 20 is preferably greater than the fin width $w_f$. When a semiconductor fin 22 is fabricated from an SOI structure, the fin height $h_f$ is typically approximately equal to the thickness of the semiconductor layer of the SOI structure (see e.g., FIG. 1).

It is desired to have FinFET transistor co-existing on a same chip as conventional planar transistors for certain applications. But such desire to have planar transistors and multiple-gate transistors co-existing on a same chip presents unique problems because the active regions for the planar transistors are decreasing and the active regions (fins) for the multiple-gate transistors are desired to be taller. Thus, a need exists for methods and structures of providing planar transistors and multiple-gate transistors on a same chip, e.g., on SOI substrate structures.

SUMMARY OF THE INVENTION

The problems and needs outlined above may be addressed by embodiments of the present invention. In accordance with one aspect of the present invention, a semiconductor device is provided, which includes an insulator layer, a first portion of a semiconductor layer, a second portion of the semiconductor layer, a planar transistor, and a multiple-gate transistor. The planar transistor is formed on the first portion of the semiconductor layer. The first portion of the semiconductor layer overlies the insulator. The first portion of the semiconductor layer has a first thickness. The multiple-gate transistor is formed on the second portion of the semiconductor layer. The second portion of the semiconductor layer overlies the insulator. The second portion of the semiconductor layer has a second thickness. The second thickness is larger than the first thickness.

In accordance with another aspect of the present invention, a semiconductor device includes an insulator layer, a first portion of a semiconductor layer, a second portion of the semiconductor layer, a first transistor, and a second transistor. The first portion of the semiconductor layer overlies the insulator. The first portion of the semiconductor layer has a first thickness. The second portion of the semiconductor layer overlies the insulator. The second portion of the semiconductor layer has a second thickness. The second thickness is larger than the first thickness. The first transistor has a first active region formed from the first portion of the semiconductor layer. The second transistor has a second active region formed from the second portion of the semiconductor layer.

In accordance with yet another aspect of the present invention, a semiconductor device includes an insulator layer, a first portion of a semiconductor layer, a second portion of the semiconductor layer, a first transistor, and a second transistor. The first portion of the semiconductor layer overlies the insulator. The first portion of the semiconductor layer has a first thickness of less than about 400 angstroms. The second portion of the semiconductor layer overlies the insulator. The second portion of the semiconductor layer has a second thickness of greater than about 100 angstroms, but the second thickness is larger than the first thickness. The first transistor has a first active region formed from the first portion of the semiconductor layer. The second transistor having a second active region formed from the second portion of the semiconductor layer.

In accordance with still another aspect of the present invention, a method of fabricating a semiconductor device is provided. This method includes the following steps described in this paragraph. The order of the steps may vary, may be sequential, may overlap, may be in parallel, and combinations thereof. Part of a first portion of a semiconductor layer is removed to provide a first thickness of the first portion, and so that a second thickness of a second portion of the semiconductor layer is larger than the first thickness. The semiconductor layer is overlying an insulator layer. A first active region for a first transistor is formed from the first portion of the semiconductor layer. A second active region for a second transistor is formed from the second portion of the semiconductor layer.

Note that although the term "layer" is used throughout the specification and in the claims, the resulting features formed using the "layer" should not be interpreted together as a continuous or uninterrupted feature. As will be clear from reading the specification, the semiconductor layer will be separated into distinct and isolated features (e.g., active regions), some or all of which comprise portions of the semiconductor layer.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 2:
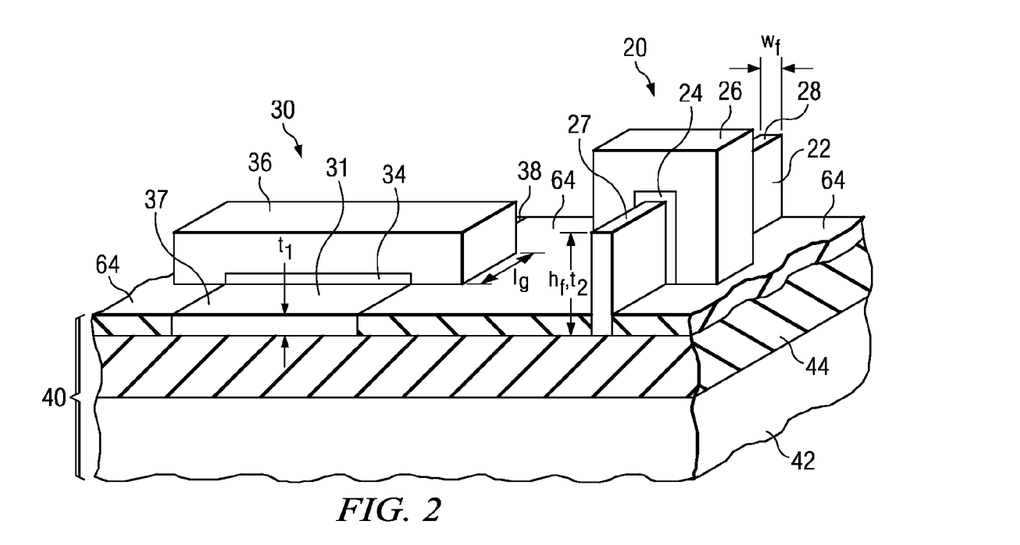
FIG. 2 is a perspective view showing part of an SOI chip having a planar transistor and a multiple-gate transistor formed in accordance with a first embodiment of the present invention.

FIG. 2 is a perspective view for a portion of a semiconductor structure incorporating a first embodiment of the present invention. In FIG. 2, a planar transistor 30 and a multiple-gate transistor 20 are shown formed on a semiconductor-on-insulator (SOI) substrate structure 40. The planar transistor 30 has a first active region 31 with a generally thin, planar shape. The multiple-gate transistor 20 has a second active region 22 with a generally tall, fin shape. The first and second active regions 31, 22 are formed from a same semiconductor layer of the SOI structure 40. The first active region 31 has a first thickness $t_1$. The second active region 22 has a second thickness $t_2$. The second thickness $t_2$ is larger than the first thickness $t_1$.

The first thickness $t_1$ is preferably less than about 400 angstroms, and even more preferably less than about 200 angstroms. The first thickness $t_1$ may be less than half of the gate length $l_g$ for the planar transistor 30, and more preferably the first thickness $t_1$ is less than one third of the gate length $l_g$. For example, if the gate length $l_g$ of the planar transistor 30 is 300 angstroms (30 nm), the first thickness $t_1$ may be less than 150 angstroms or more preferably less than 100 angstroms. When the first thickness $t_1$ is less than half or one third of the gate length $l_g$, the planar transistor 30 may be referred to as an ultra-thin body (UTB) transistor. A first gate dielectric 34 is overlying a first channel region in the first active region 31. A first gate electrode 36 is overlying the first gate dielectric 34. Source and drain regions 37, 38 of the planar transistor 30 are formed in the first active region 31 oppositely adjacent the first gate electrode 36.

Still referring to FIG. 2, the second thickness $t_2$ (i.e., $h_f$) for the fin structure of the second active region 22 is preferably greater than about 100 angstroms, and more preferably greater than about 400 angstroms, for example. The fin width $w_f$ is preferably greater than about 500 angstroms. A second gate dielectric 24 is overlying a second channel region in the second active region 22. The second gate dielectric 24 at least partially wraps around the second channel region of the fin 22. A second gate electrode 26 is overlying the second gate dielectric 24. The second gate dielectric 24 electrically insulates the second gate electrode 26 from the fin of the second active region 22. The multiple-gate transistor 20 shown in FIG. 2 is a triple-gate transistor because the second gate electrode 26 extends along three sides (along at least part of the two sidewalls and along the top surface of the fin 22) of the second channel region of the fin 22. Source and drain regions 27, 28 of the multiple-gate transistor 20 are formed in the second active region 22 oppositely adjacent the second gate electrode 26. Because a substantial fraction of the drive current flowing from the source 27 to the drain 28 flows on the sidewall surfaces, it is often advantageous to have a tall fin 22 (see e.g., example dimensions described above) for the multiple-gate transistor 20.

Although not shown, the planar transistor 30 and/or the multiple-gate transistor 20 of FIG. 2 may also have spacers formed on the sidewalls of the gate electrodes 26, 36. Such spacers may be useful in doping the source and drain regions 27, 28, 37, 38, for example. Also, the planar transistor 30 and/or the multiple-gate transistor 20 of an embodiment may have elevated source and drain regions, or raised source and drain regions (not shown). The source and drain regions may also be strapped with a conductive material such as a silicide. In such case, the spacers prevent conductive silicide material on the source and drain regions from making electrical contact with the gate electrode, which would lead to undesirable shorting of the source or drain regions to the gate electrode.

Figure 3:
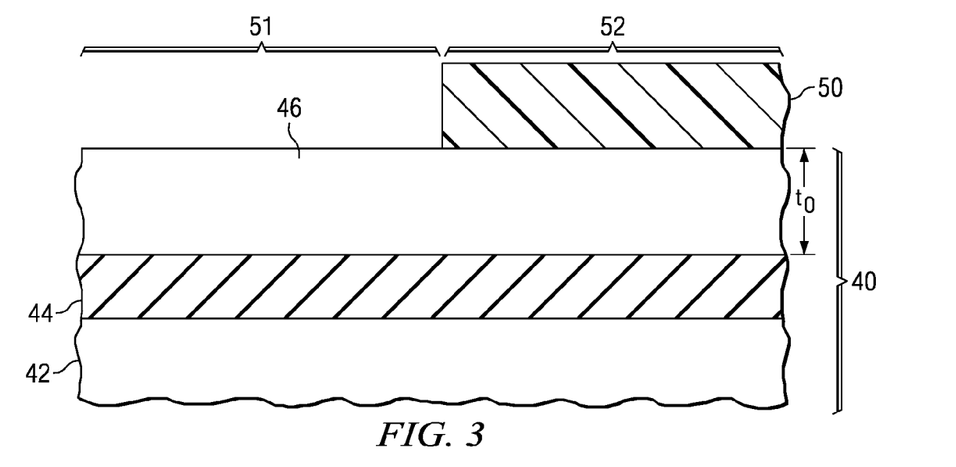
FIGS. 3-8 illustrate some steps of a method of forming the first embodiment structure shown in FIG. 2.

FIGS. 3-8 illustrate a method of fabricating the structure of the first embodiment shown in FIG. 2. Referring to FIG. 3, the SOI substrate structure 40 in this example has a substrate 42, an insulator layer 44, and a semiconductor layer 46. The insulator layer 44 is overlying the substrate 42, and the semiconductor layer 46 is overlying the insulator 44. The insulator layer 44 may be any suitable dielectric, such as silicon oxide ($SiO_2$), aluminum oxide, or silicon nitride, for example. The semiconductor layer 46 may be a single homogenous layer or a composite layer (e.g., strained silicon structure), for example. The semiconductor layer 46 may include silicon, germanium, a silicon germanium compound, gallium arsenide, indium phosphate, or combinations thereof, for example. In the example of the first embodiment shown in FIGS. 2-8, the SOI structure 40 is a silicon-on-insulator structure. However, an embodiment of the present invention may be applied to silicon-germanium-on-insulator (SGOI) chips as well, for example. All or part of the initial SOI substrate structure 40 (e.g., as shown in FIG. 3) may be made by a manufacturer fabricating a semiconductor device or part of a semiconductor device incorporating an embodiment of the present invention, or the manufacturer may obtain a blank SOI wafer or SGOI wafer from another manufacturer, for example.

In FIG. 3, a patterned mask 50 is shown overlying the semiconductor layer 46. The patterned mask 50 is open over a first portion 51 of the semiconductor layer 46 and covers a second portion 52 of the semiconductor layer 46. The semiconductor layer 46 has an initial thickness $t_o$, which is equal to or greater than the resulting second thickness $t_2$ for the fin height $h_f$ of the multiple-gate transistor 20 (see FIG. 2). If the initial thickness $t_o$ is greater than the desired second thickness $t_2$, the thickness of the second portion 52 of the semiconductor layer 46 may be reduced at any stage in the method or prior to FIG. 3, for example.

Figure 4:
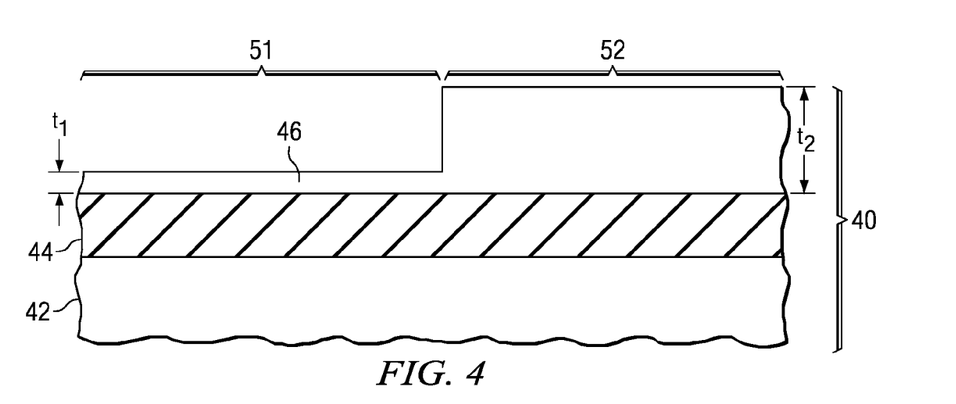

The exposed first portion 51 of the semiconductor layer 46 is thinned. Part of the first portion 51 of the semiconductor layer 46 is removed to provide the first thickness $t_1$ in the first portion 51, as shown in FIG. 4. If the semiconductor layer 46 is silicon, as is the case of this example embodiment, the first portion 51 may be thinned by a silicon thinning process. Such a silicon thinning process may include the steps of oxidizing a top portion of the exposed silicon 51 to form a silicon oxide, followed by a removal of the silicon oxide at the first portion 51. In such case, the patterned mask 50 may be made from a material, e.g., silicon nitride, that is able to withstand the high temperatures employed in silicon oxidation. The patterned mask 50 may be a multi-layer mask, e.g., comprising a silicon nitride layer on silicon oxide layer, for example. The removal of part of the semiconductor material 46 from the first portion 51 may be an etch process (e.g., wet etching, dry plasma etching employing a fluorine chemistry, reactive ion etching). If etching is used, the patterned mask 50 may be any suitable or common masking material, e.g., photoresist, that is able to withstand or sufficiently block the etching process over the second portion 52. After the thinning of the semiconductor layer 46 in the first portion 51, the patterned mask 50 is removed, as shown in FIG. 4.

Figure 5:
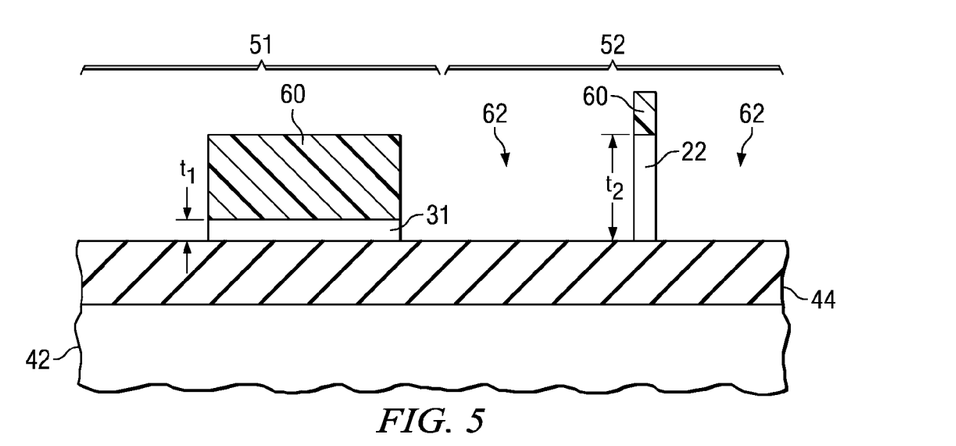
Figure 6:
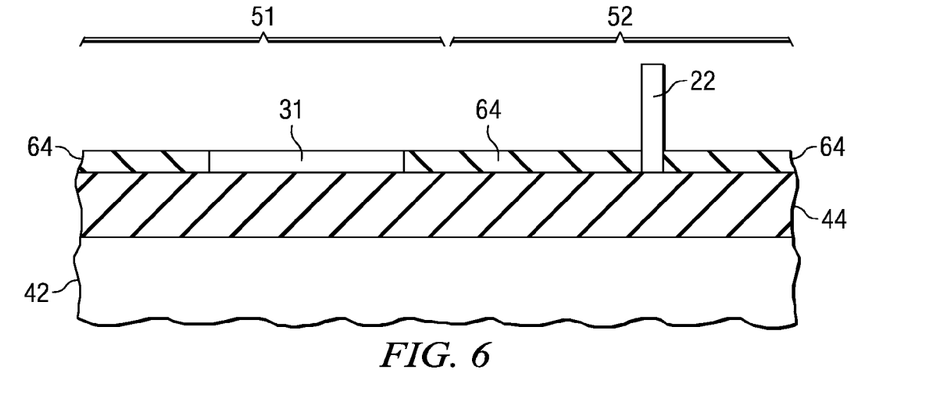

To form the first and second active regions 31, 22, a patterned active region mask 60 is provided over the first and second portions 51, 52 of the semiconductor layer 46. Material of the semiconductor layer 46 is removed in alignment with the active region mask 60, as shown in FIG. 5, to form the first and second active regions 31, 22. The removal of the semiconductor material for forming the active regions 31, 22 may be performed by an etching process (e.g., wet etching, dry plasma etching employing a fluorine chemistry, reactive ion etching)—preferably a dry plasma etching process. Spaces or trenches 62 exist between the first active regions 31 (thinned and patterned semiconductor layer regions in the first portion 51), between the second active regions 22 (vertical fin shaped semiconductor layer regions in the second portion 52), and/or between first and second active regions 31, 22. A dielectric material 64 may be used to fill the spaces/trenches 62 to form isolation regions or isolation structures between and/or around the active regions 31, 22, as shown in FIG. 6, for example. The active region mask 60 is then removed, as also shown in FIG. 6. The dielectric material 64 forming the isolation regions preferably has a thickness about the same as the first thickness $t_1$ for the first active region 31 of the planar transistor 30. However, in other embodiments, the thickness of the dielectric material 64 may be different than the first thickness $t_1$.

Figure 7:
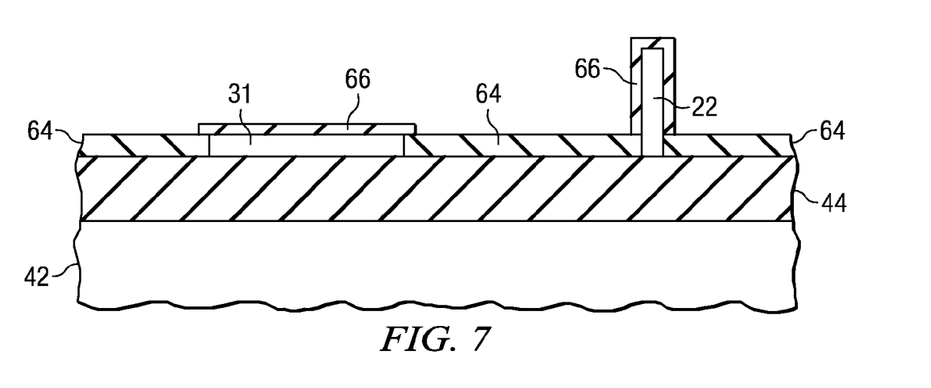
Figure 11A:
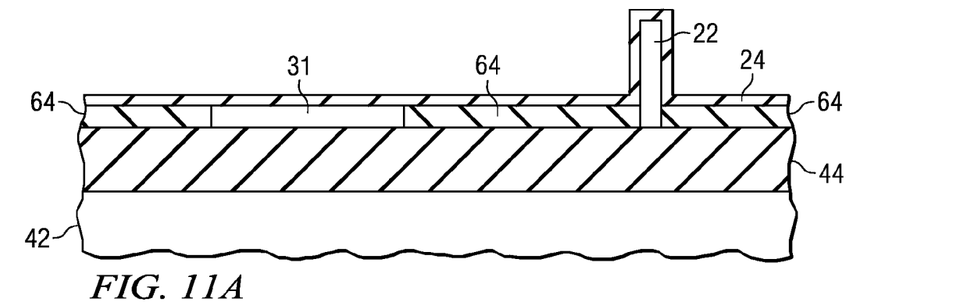
FIGS. 11A-11D illustrate some steps of a method of forming an embodiment of the present invention.
Figure 11B:
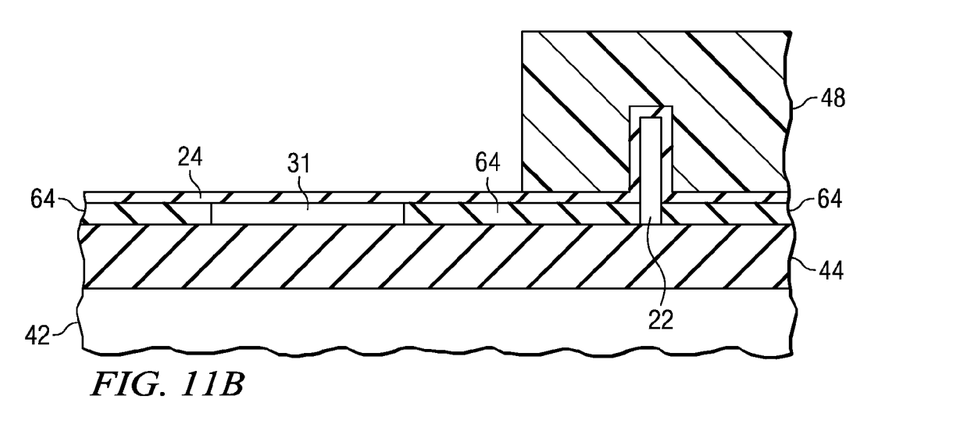
Figure 11C:
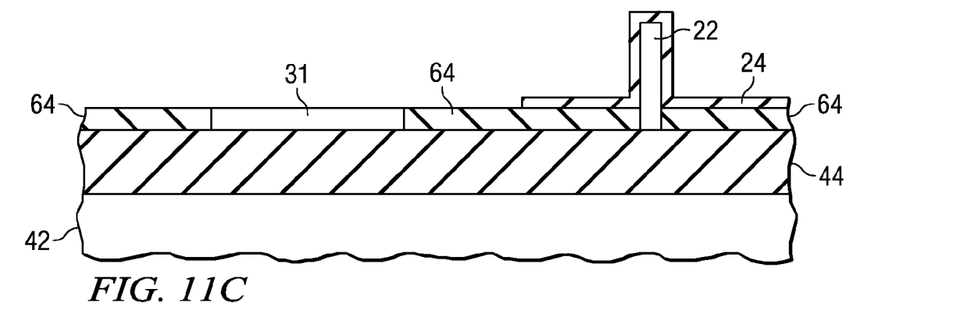
Figure 11D:
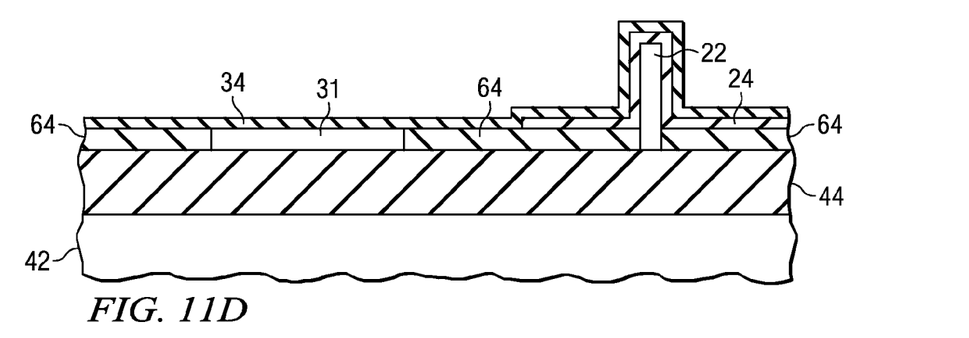

Gate dielectric material 66 is formed over a active regions 31, 22, as shown in FIG. 7. The first and second gate dielectrics 34, 24 for the first and second active regions 31, 22 may be the same material and formed from the same layer 66, as shown in FIG. 7. In other embodiments (not shown), however, the first gate dielectric 34 may be different (e.g., different material(s), different physical thickness, and/or different equivalent silicon oxide thickness, etc.) than the second gate dielectric 24. The gate dielectrics 34, 24 may be formed using any currently known or future developed gate dielectric formation process, such as thermal oxidation, nitridation, sputter deposition, chemical vapor deposition, masked and etched, or combinations thereof, for example. The physical thickness of the gate dielectrics 34, 24 may be between about 5 angstroms and about 100 angstroms, for example. The gate dielectrics 34, 24 may be made from any suitable gate dielectric material, including (but not limited to): silicon oxide, silicon oxynitride, high-k dielectric material, or combinations thereof, for example. A high-k dielectric material preferably has a relative permittivity greater than 7, including (but not limited to): aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$) cerium oxide ($CeO_2$), titanium oxide ($TiO_2$), tantalum oxide ($Ta_2O_5$), and combinations thereof, for example. In a preferred embodiment, the second gate dielectric 24 has an equivalent silicon oxide thickness larger than that of the first gate dielectric 34. For example, the first gate dielectric 34 may have an equivalent silicon oxide thickness of about 12 angstroms and the second gate dielectric 24 may have an equivalent silicon oxide thickness of about 16 angstroms. Any of a variety of currently known or future developed techniques for forming gate dielectrics with different physical thicknesses and/or different equivalent silicon oxide thicknesses and/or different materials and/or different material combinations over the first and second active regions 31, 22 may be implemented in an embodiment of the present invention. One way in which gate dielectrics of different physical thickness may be formed is described here and illustrated in FIGS. 11A-11D, for example. A second gate dielectric material 24 of a second thickness is deposited in both the first and the second active regions 31, 22. A mask 48 is formed that covers the second gate dielectric material 24 at the second active region 22 but exposes the second gate dielectric material 24 at the first active region 31 (see FIG. 11B). The second gate dielectric material 24 at the first active region is then removed. This is followed by removal of the mask 48 (see FIG. 11C). A first gate dielectric material is then deposited over at least the first active region 31 to form the first gate dielectric 34 (see FIG. 11D). The first gate dielectric material 34 may remain or may be removed from the second gate dielectric material 24.

Figure 8:
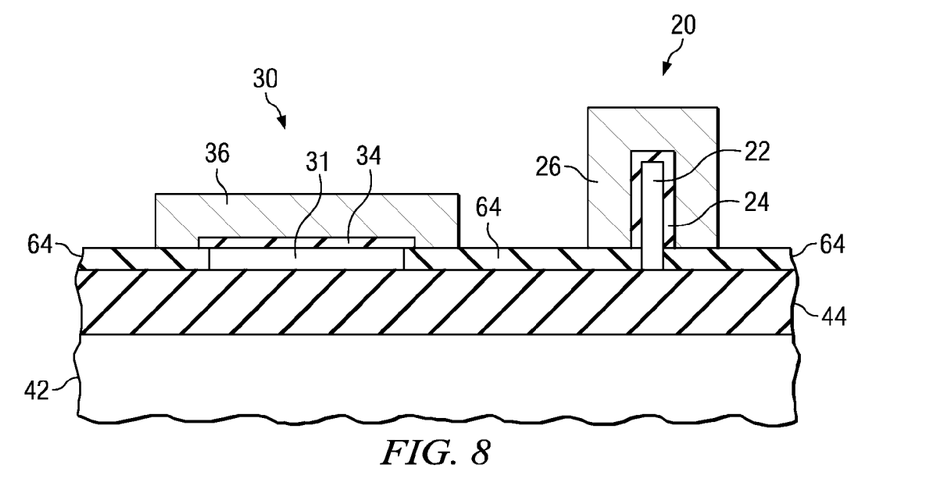

After the first and second gate dielectrics 34, 24 are formed, the first and second gate electrodes 36, 26 are deposited and patterned, as shown in FIG. 8. The first and second gate electrodes 36, 26 for the first and second active regions 31, 22 may be the same material and formed from the same layer. In other embodiments (not shown), however, the first gate electrode 36 may be different (e.g., different material, different thickness, etc.) than the second gate electrode 26. The gate electrode material for the first and second gate electrodes 36, 26 may be any suitable gate electrode material, including (but not limited to): poly-crystalline silicon, poly-crystalline silicon germanium, metals, metallic silicides, metallic nitrides, conductive metallic oxides, or combinations thereof, for example. In a preferred embodiment, the gate electrodes 36, 26 comprise poly-crystalline silicon, for example. Metals such as molybdenum, tungsten, titanium, platinum, and hafnium may be used as the top electrode portion, for example. Metallic nitrides may include (but are not limited to) molybdenum nitride, tungsten nitride, titanium nitride, and tantalum nitride, for example. Metallic silicides may include (but are not limited to) nickel silicide, tungsten silicide, cobalt silicide, titanium silicide, tantalum silicide, platinum silicide, and erbium silicide, for example. And, conductive metallic oxides may include (but are not limited to) ruthenium oxide and indium tin oxide, for example.

The gate electrodes 36, 26 may be deposited using any currently known or future developed gate electrode formation process, such as chemical vapor deposition, for example. The gate electrodes 36, 26 also may be formed by the deposition of silicon and metal, followed by an anneal to form a metal silicide gate electrode material, for example. A patterned gate mask (not shown) may be formed on the gate electrode material using deposition and photolithography techniques, for example. The gate mask may incorporate commonly used masking materials, such as (but not limited to) silicon oxide, silicon oxynitride, or silicon nitride, for example. The gate electrode may be etched using plasma etching to form the patterned gate electrodes 36, 26, as shown in FIG. 8, for example. The gate dielectric material not covered by the gate electrode is usually etched away during the gate electrode etching. The result of this example method provides the structure of the first embodiment shown in FIG. 2.

Although not shown in the first embodiment example, a source and drain extension implant may be performed. In such case, spacers (not shown) will typically be formed by deposition of a spacer dielectric material (e.g., silicon nitride) followed by anisotropic etching, for example. The spacers may be formed from multiple layers of different dielectrics, such as silicon nitride and silicon oxide, for example. Formation of the spacers will typically be followed by a second and deeper source and/or drain implant. The resistance of the source, drain, and gate electrode in a transistor may be reduced by strapping the source/drain regions with a silicide (e.g., using a self-aligned silicide (salicide) process, or other metal deposition process), for example.

Figure 9:
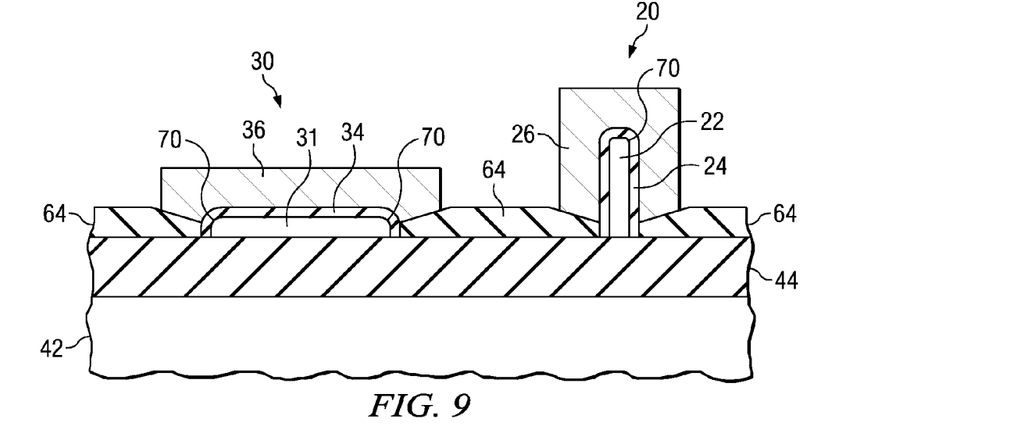
FIG. 9 is a side view illustrating a second embodiment of the present invention.

FIG. 9 shows a second embodiment of the present invention. In the second embodiment, corners 70 of the active regions are rounded. The corners 70 may be rounded after the step shown in FIG. 5, for example, by performing a corner rounding process. The corners 70 may be rounded by an annealing process using a temperature between about 700 degrees Celsius and about 1000 degrees Celsius to promote silicon atom migration, for example. Such an annealing process may employ an ambient of a gas, such as hydrogen, nitrogen, helium, neon, argon, xenon, or combinations thereof, for example, at a pressure between about 1 and 1000 Torr, for example. The annealing ambient is preferably a hydrogen-containing ambient with a pressure between about 10 and 1000 Torr and a temperature between about 700 and 950 degrees Celsius, for example. As another example, the corner rounding process may include an anneal in a hydrogen-containing ambient with a pressure between about 5 and about 20 Torr, for a duration of between about 15 and about 35 seconds, at a temperature between about 800 and about 1000 degrees Celsius. Other process conditions outside of these example ranges may also be feasible. The rounded corners 70 may have a radius of curvature between about 10 angstroms and about 200 angstroms, for example.

Figure 10:
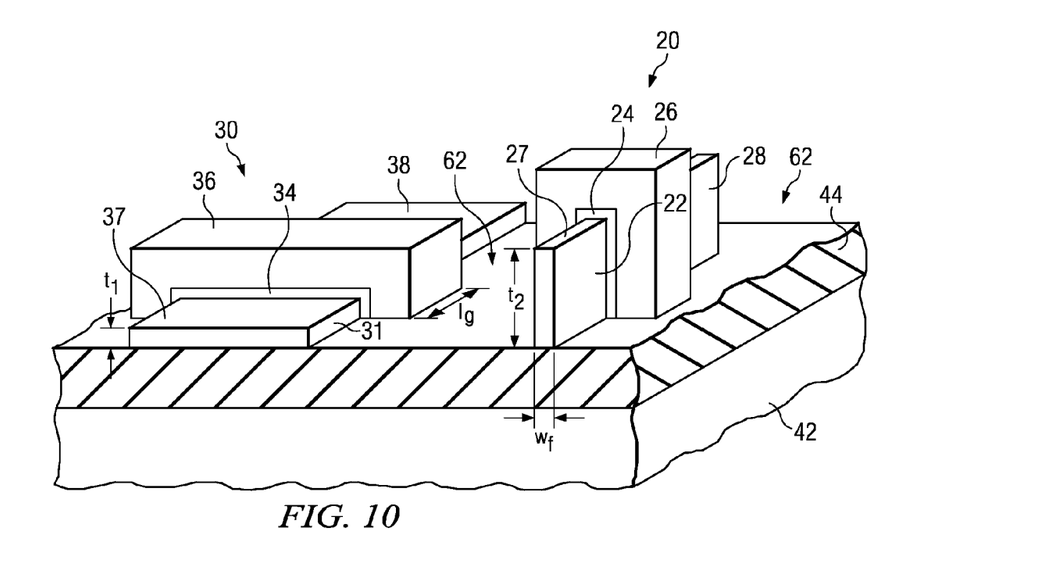
FIG. 10 is a perspective view showing part of an SOI chip having a planar transistor and a multiple-gate transistor formed in accordance with a third embodiment of the present invention using mesa isolation.

FIG. 10 shows a third embodiment of the present invention. In the third embodiment, the trenches or spaces 62 between active regions 31, 22 are not filled with a dielectric material (e.g., deleting step of forming dielectric material 64 at FIG. 6). Thus, in the resulting structure shown in FIG. 10, the transistors 20, 30 are electrically isolated from each other by mesa isolation.

As a variation on a method of forming an embodiment of the present invention, steps of forming the active region mask 60 and removing portions of the semiconductor layer 46 to form the plan-view shapes/profiles of the active regions 31, 22 (see e.g., FIG. 5) may be performed before the steps of forming the patterned mask 50 and removing part of the first portion 51 of the semiconductor layer 46 to thin the first portion 51 to the first thickness $t_1$ (see e.g., FIGS. 3-4).

Although the illustrative embodiments shown and described above have a planar transistor 30 in the first portion 51 and a multiple-gate transistor 20 in the second portion 52, other types and/or configurations of transistors may be formed in the first and/or second portions 51, 52 in other embodiments. Although the embodiments shown herein and described above are discussed in terms of forming one transistor 30 in the first portion 51 and one transistor 20 in the second portion 52 to simplify the discussion and figures, it is understood that there will typically be numerous transistors in each portion 51, 52 and that there may be numerous first and/or second portions 51, 52 that may or may not be contiguous with each other.

Although embodiments of the present invention and at least some of its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   forming a first transistor comprising:
      forming a first active region over an insulator layer and having a first height;
      forming a first gate dielectric on a top surface and sidewalls of the first active region; and
      forming a first gate electrode on the first gate dielectric; and
   forming a second transistor comprising:
      forming a second active region over the insulator layer and having a second height greater than the first height;
      forming a second gate dielectric on a top surface and sidewalls of the second active region; and
      forming a second gate electrode on the second gate dielectric.

2. The method of claim 1, wherein the steps of forming the first active region and the second active region comprise:
   providing a semiconductor layer over the insulator layer, with the semiconductor layer having the second height;
   thinning a first portion of the semiconductor layer to the first height, wherein a second portion of the semiconductor layer is not thinned;
   patterning the semiconductor layer, wherein a remaining portion of the first portion of the semiconductor layer forms the first active region, and wherein a remaining portion of the second portion of the semiconductor layer forms the second active region.

3. The method of claim 2, wherein the step of thinning the first portion of semiconductor layer comprises:
   covering the second portion of the semiconductor layer with a mask;
   oxidizing a top layer of the first portion of the semiconductor layer to form an oxide layer; and
   removing the oxide layer.

4. The method of claim 1, wherein the first height is less than about a half of the second height.

5. The method of claim 4, wherein the first height is less than about a third of the second height.

6. The method of claim 1, wherein the first height is less than about 100 angstroms.

7. The method of claim 1, wherein the second height is greater than about 400 angstroms.

8. A method of fabricating a semiconductor device, the method comprising:
- providing a semiconductor-on-insulator (SOI) substrate comprising an insulator layer and a semiconductor layer over the insulator layer, wherein the semiconductor layer comprises a first portion in a first device region, and a second portion in a second device region;
- thinning the first portion of the semiconductor layer, wherein the second portion of the semiconductor layer is not thinned;
- patterning the first portion and the second portion of the semiconductor layer to form a first active region and a second active region, respectively;
- forming a first gate dielectric on a top surface and sidewalls of the first active region;
- forming a first gate electrode on the first gate dielectric;
- forming a second gate dielectric on a top surface and sidewalls of the second active region; and
- forming a second gate electrode on the second gate dielectric.

9. The method of claim 8, wherein the first gate electrode and second gate electrode are formed of a same material.

10. The method of claim 8, wherein the semiconductor layer comprises silicon, and wherein the step of thinning the first portion of the semiconductor layer comprises:
- providing a patterned mask that covers at least part of the second portion and is open over the first portion of the semiconductor layer;
- oxidizing an exposed top portion of the first portion of the semiconductor layer to form a silicon oxide;
- removing the silicon oxide; and
- removing the patterned mask.

11. The method of claim 8, wherein the second active region is a fin with a fin height less than about 100 angstroms.

12. The method of claim 8, wherein the semiconductor layer comprises a material selected from the group consisting of silicon, germanium, silicon germanium, and combinations thereof.

13. The method of claim 8 further comprising:
- performing an annealing process to round corners on the first active region and the second active region.

14. The method of claim 13, wherein at least some of the rounded corners have a radius of curvature between about 10 angstroms and about 200 angstroms.

15. The method of claim 13, wherein the step of annealing is performed in a hydrogen-containing ambient with a pressure between about 5 and about 20 Torr, for a duration of between about 15 and about 35 seconds, and at a temperature between about 800 and about 1000 degrees Celsius.

* * * * *